(12) United States Patent
Winkler et al.

(10) Patent No.: US 12,467,137 B2
(45) Date of Patent: *Nov. 11, 2025

(54) SEMICONDUCTOR PROCESSING DEVICE

(71) Applicant: ASM IP Holding B.V., Almere (NL)

(72) Inventors: Jereld Lee Winkler, Gilbert, AZ (US);
Eric James Shero, Phoenix, AZ (US);
Carl Louis White, Gilbert, AZ (US);
Shankar Swaminathan, Phoenix, AZ
(US); Bhushan Zope, Phoenix, AZ
(US)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/586,902

(22) Filed: Feb. 26, 2024

(65) Prior Publication Data

US 2024/0200189 A1  Jun. 20, 2024

Related U.S. Application Data

(63) Continuation of application No. 17/014,820, filed on Sep. 8, 2020, now Pat. No. 11,946,136.

(60) Provisional application No. 62/903,566, filed on Sep. 20, 2019.

(51) Int. Cl.
C23C 16/448 (2006.01)
H01L 21/02 (2006.01)

(52) U.S. Cl.
CPC ...... *C23C 16/448* (2013.01); *H01L 21/02271* (2013.01); *H01L 21/0262* (2013.01)

(58) Field of Classification Search
CPC ........... H01L 21/02271; H01L 21/0262; C23C 14/54; C23C 16/448; C23C 16/4481; C23C 16/45544; C23C 16/45557; C23C 16/45561; C23C 16/52; G05B 11/42

See application file for complete search history.

(56) References Cited

U.S. PATENT DOCUMENTS

| 9,777,377 B2 | 10/2017 | Okura et al. |
| 11,946,136 B2* | 4/2024 | Winkler ............ H01L 21/02271 |
| 2013/0312663 A1 | 11/2013 | Khosla et al. |
| 2015/0140694 A1* | 5/2015 | Inoue ................ C23C 16/45561 |
| | | 118/712 |
| 2015/0246329 A1 | 9/2015 | Itonaga et al. |
| 2016/0047047 A1 | 2/2016 | Moroi |
| 2017/0092549 A1 | 3/2017 | Yagi et al. |
| 2019/0284684 A1 | 9/2019 | Shigaki et al. |

FOREIGN PATENT DOCUMENTS

| JP | H03141192 A | 6/1991 |
| JP | 2000104172 A | 4/2000 |
| JP | 2003141192 A | 5/2003 |
| JP | 2017066511 A | 4/2017 |
| KR | 20130076468 A | 7/2013 |

* cited by examiner

*Primary Examiner* — Brook Kebede
(74) *Attorney, Agent, or Firm* — Snell & Wilmer L.L.P.

(57) ABSTRACT

A semiconductor processing device is disclosed. The device can include a reactor and a solid source vessel configured to supply a vaporized solid reactant to the reactor. A process control chamber can be disposed between the solid source vessel and the reactor. The device can include a valve upstream of the process control chamber. A control system can be configured to control operation of the valve based at least in part on feedback of measured pressure in the process control chamber.

20 Claims, 2 Drawing Sheets

SEMICONDUCTOR PROCESSING DEVICE

CROSS-REFERENCE TO RELATED APPLICATIONS

This application is a continuation of, and claim priority to and the benefit of, U.S. patent application Ser. No. 17/014,820, filed Sep. 8, 2020 and entitled "SEMICONDUCTOR PROCESSING DEVICE," which is a nonprovisional of, and claims priority to and the benefit of, U.S. Provisional Patent Application No. 62/903,566, filed Sep. 20, 2019, which are hereby incorporated by reference herein.

BACKGROUND

Field

The field relates to a semiconductor processing device and, in particular, to a semiconductor processing device that includes a process control chamber upstream of a reaction chamber.

Description of the Related Art

During semiconductor processing, various reactant vapors are fed into a reaction chamber. In some applications, reactant vapors of source chemicals that are in solid phase at ambient pressure and temperature are used. These solid source substances may be heated to sublimation to produce vaporized reactant for a reaction process, such as vapor deposition. Chemical Vapor Deposition (CVD) may call for the supply of continuous streams of reactant vapor to the reaction chamber, while Atomic Layer Deposition (ALD), pulsed CVD and hybrids thereof may call for continuous streams or pulsed supply to the reaction chamber, depending on the desired configuration, including time-divided and spaced-divided pulsed processes. Vapor phase reactant from such solid substances can also be useful for other types of chemical reactions for the semiconductor industry (e.g., etching, doping, etc.) and for a variety of other industries. However, due in part to small process windows between vaporization and decomposition temperatures, low vapor pressure and needs for uniform dosage for such solid reactants, there remains a continuing demand for improved control over vapor phase delivery from the solid reactant source.

SUMMARY

In one embodiment, a semiconductor processing device is disclosed. The semiconductor processing device can include a reactor and a solid source vessel configured to supply a vaporized reactant to the reactor. The semiconductor processing device can include a process control chamber in fluid communication with the solid source vessel and the reactor between the solid source vessel and the reactor. A process control valve can be disposed upstream of the process control chamber between the solid source vessel and the process control chamber. The semiconductor processing device can include a control system configured to control operation of the process control valve based at least in part on feedback of measured pressure in the process control chamber.

In another embodiment, a device for forming a vaporized reactant is disclosed. The device can include a solid source vessel disposed in a first thermal zone at a first temperature. The device can include a process control chamber downstream of and in fluid communication with the solid source vessel. The process control chamber can be disposed in a second thermal zone at a second temperature that is higher than the first temperature and can be configured to transfer the vaporized reactant to a reactor downstream of the process control chamber. The device can include a process control valve upstream of the process control chamber and disposed in the second thermal zone between the solid source vessel and the process control chamber. A control system can be configured to control operation of the process control valve based at least in part on feedback of measured pressure in the process control chamber.

In another embodiment, a method of forming a vaporized reactant is disclosed. The method can comprise vaporizing a solid reactant to form a reactant vapor. The method can comprise transferring the reactant vapor to a process control chamber. The method can include controlling operation of a process control valve upstream of the process control chamber based at least in part on feedback of measured pressure in the process control chamber. The method can include transferring the reactant vapor from the process control chamber to a reaction chamber.

BRIEF DESCRIPTION OF THE DRAWINGS

These and other features, aspects and advantages of the present invention will now be described with reference to the drawings of several embodiments, which embodiments are intended to illustrate and not to limit the invention.

DETAILED DESCRIPTION

Figure 1:
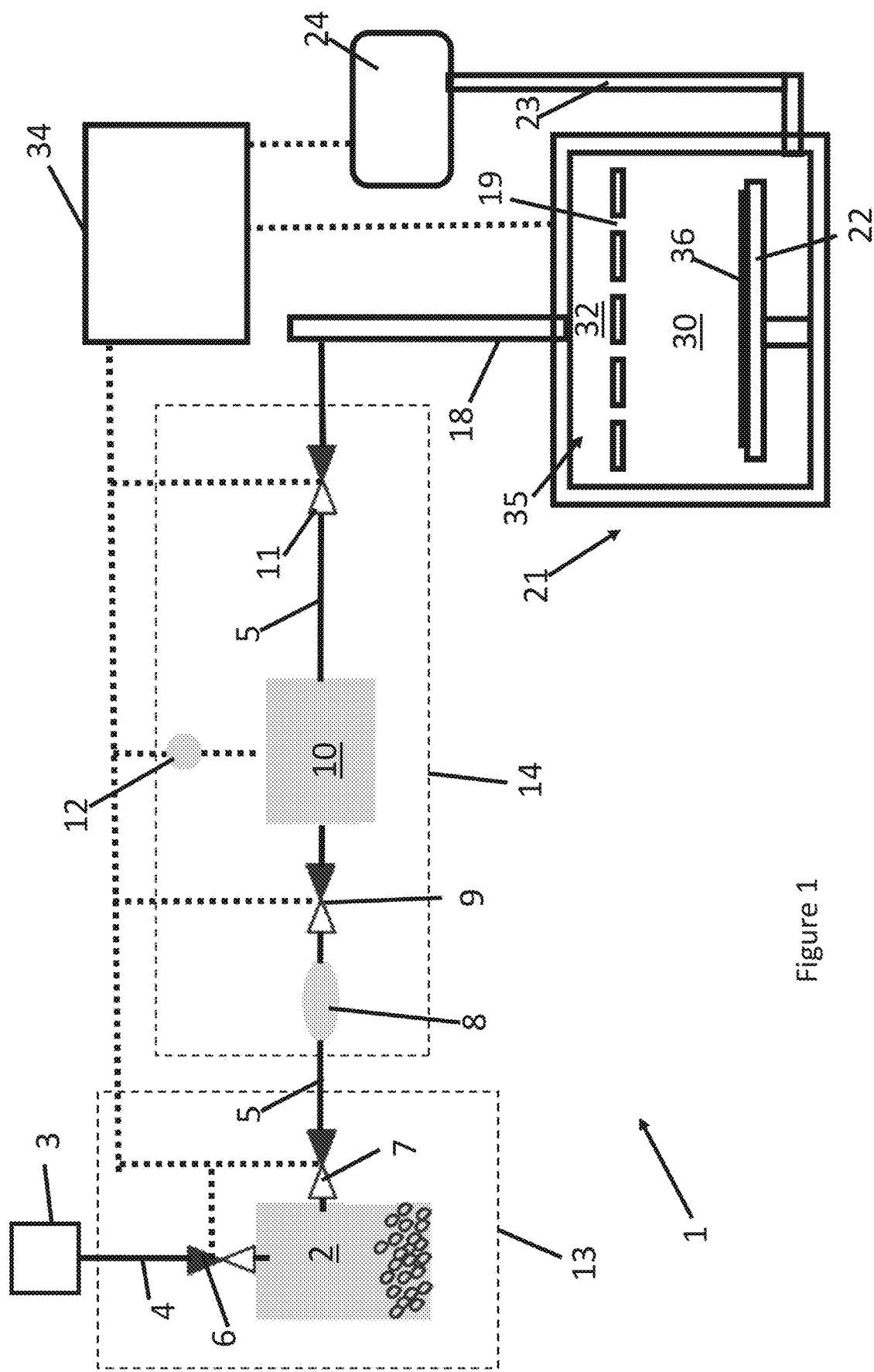
FIG. 1 is a schematic system diagram of a semiconductor processing device, according to one embodiment.

The embodiments disclosed herein relate to a semiconductor processing device that improves the control of vapor phase delivery of a solid reactant, such as deposition precursor. The embodiments disclosed herein can be used in conjunction with any suitable type of semiconductor processing device, including an atomic layer deposition (ALD) device, a chemical vapor deposition (CVD) device, a device configured for variants of such pulsed processes, a metalorganic CVD (MOCVD) device, a physical vapor deposition device (PVD), etc.

For example, ALD is a method for growing highly uniform thin films onto a substrate. In a time-divided ALD reactor, the substrate is placed into reaction space free of impurities and at least two different reactants (precursor or other reactant vapors) are injected in vapor phase alternately and repetitively into the reaction space. Reactant vapors can accordingly comprise a vapor that includes one or more reactants and one or more solvents. The film growth is based on alternating surface reactions that take place on the surface of the substrate to form a solid-state layer of atoms or molecules, because the reactants and the temperature of the substrate are chosen such that the alternately-injected vapor-phase reactant's molecules react only on the substrate with its surface layer. The reactants are injected in sufficiently high doses for the surface to be close to saturated during each injection cycle. Therefore, the process can be theoretically self-regulating, being not dependent on the concentration of the starting materials, whereby it is possible to achieve extremely high film uniformity and a thickness accuracy of a single atomic or molecular layer. Similar results are obtained in space-divided ALD reactors, where the substrate is moved into zones for alternate exposure to different reactants. Reactants can contribute to the growing film (precursors) and/or serve other functions, such as oxidizing, reducing or stripping ligands from an adsorbed species of a precursor to facilitate reaction or adsorption of subsequent reactants. The ALD method can be used for growing both elemental and compound thin films. ALD can involve alternate two or more reactants repeated in cycles, and different cycles can have different numbers of reactants. True ALD reactions tend to produce less than a monolayer per cycle. Practical application of ALD principles tend to have real world deviation from true saturation and monolayer limitations, and hybrid or variant process can obtain higher deposition rates while achieving some or all of the conformality and control advantages of ALD.

As explained herein, solid reactant sources (or reactant-solvent mixtures) can be sublimated in a heated vessel to form a reactant vapor to be delivered to the reactor or reaction chamber. However, the sublimation of the solid reactant material can be a slow process, e.g., an order of magnitude slower than liquid reactant evaporation systems. Moreover, the sublimation rate of the solid reactant material can vary depending on the source vessel geometry, the surface area of the solid precursor particles, irregularly shaped solid reactant particle, and other components of the semiconductor processing system. For example, in some cases, the surface areas of the solid reactant particles can change during operation as solid particles agglomerate. The sublimation rate can change over time during operation, and the supply of vaporized reactant to the reaction chamber may also be inconsistent and variable.

In some semiconductor processing devices, the solid source reactant dose can be controlled by controlling the vapor pressure in the solid source vessel, the flow rate through the solid source vessel, and the pulse time. For example, a control device such as a master flow controller (MFC) or pressure controller can be provided upstream of the solid source vessel. The control device may be remote from the heat source used to sublimate the solid reactant source due to the control device being incompatible with high temperature environments. If the sublimation rate changes, as explained above, the amount of reactant delivered per pulse may vary, which can reduce wafer yields and increase costs. Accordingly, there remains a continuing need for improved supply of a vaporized solid reactant to the reactor.

FIG. 1 is a schematic system diagram of a semiconductor processing device 1, according to various embodiments. The device 1 can comprise a solid source vessel 2 configured to supply a vaporized solid reactant to a reactor 21. The solid source vessel 2 can include a heater that causes sublimation of solid reactant source particles into a vaporized reactant. Examples of solid source vessels that can be used in the device 1 disclosed herein can be any suitable type of solid source vessel, including those shown and described in U.S. Pat. Nos. 7,122,085 and 8,137,462, and in U.S. Patent Publication No. US 2018/0094350, the entire contents of each of which are incorporated by reference herein in their entirety and for all purposes.

An inactive gas source 3 can supply inactive carrier gas to the solid source vessel 2 along an inactive gas line 4. In various embodiments, a gas mass flow controller (MFC) can meter the supply of gas along the inactive gas line 4. An inactive gas valve 6 can be provided along the inactive gas line 4 to regulate the flow of the inactive gas to the solid source vessel 2. The inactive gas valve 6 can comprise an adjustable valve having a plurality of flow conductance settings in some embodiments. In other embodiments, the inactive gas valve 6 can comprise a binary, on/off valve, in which the valve 6 either permits or blocks flow of the inactive gas along the inactive gas line 4. In the embodiment of FIG. 1, the inactive gas can assist in supplying and carrying the reactant vapor to the reactor 21.

The pressure and temperature of the solid source vessel 2 can be controlled such that the solid reactant particles are sublimated into reactant vapor. In the illustrated embodiment, inactive carrier gas from the inactive gas source 3 can serve to carry or drive the reactant vapor to the reactor 21. In other embodiments, the reactant vapor can be supplied along the supply line 5, without using a separate inactive carrier gas supply, based upon the vapor pressure of the heated reactant and/or downstream vacuum sources drawing the vapor. Omitting a separate inactive gas source to carry the reactant vapor through the supply line 5 can beneficially reduce the costs and complexity associated with the device 1. The reactant vapor can be supplied along a reactant vapor supply line 5 to a filter 8. A reactant gas valve 7 can be provided to meter the supply of reactant vapor to the filter 8 from the solid source vessel 2. The reactant gas valve 7 can comprise any suitable type of valve, such as an adjustable valve or a binary on/off valve. In the illustrated embodiment, for example, the reactant gas valve 7 can comprise a vessel isolation valve, e.g., a binary on/off valve. The filter 8 can be configured to capture and vaporize any liquid droplets or solid particulates that are present due to incomplete sublimation.

A process control chamber 10 can be disposed between the solid source vessel 2 and the reactor 21. The process control chamber 10 can meter or control the amount of reactant vapor that is supplied to the reactor 21 along the reactant supply line 5. The process control chamber 10 can serve as an intermediate volume in which reactant is collected in vapor form before being delivered to the reactor 21. Controlling the supply of the reactant vapor to the reactor 21 using the process control chamber 10 can beneficially enable more accurate control of reactant vapor dosage to the reactor 21.

A process control valve 9 can be disposed upstream of the process control chamber 10. In the illustrated embodiment, the process control 9 can be disposed between the filter 8 and the process control chamber 10. In other embodiments, the process control valve 9 can be disposed between the filter 8 and the solid source vessel 2. In some embodiments, the process control valve 9 can comprise a binary on/off valve that permits or blocks the flow of vaporized reactant to the process control chamber 10. Beneficially, the use of a binary on/off valve for the process control valve 9 can be relatively inexpensive and durable in use in high temperature environments. In other embodiments, the process control valve 9 can comprise a diaphragm or proportioning valve to control flow conductance of the vaporized reactant to the process control chamber 10. A reactor supply valve 11 can be disposed downstream of the process control chamber 10, e.g., between the process control chamber 10 and the reactor 21. The reactor supply valve 11 can comprise a binary on/off valve or an adjustable valve to control flow conductance, in some embodiments. For example, in the illustrated embodiment, the reactor supply valve 11 can comprise a binary valve configured to operate in high temperature environments. In some embodiments, a piezoelectric valve can be used for the reactor supply valve 11. In various embodiments, a high temperature proportioning valve can be used. Other types of valves may be suitable in other embodiments.

The reactant gas supply line 5 can supply the reactant vapor to an inlet manifold 18 of the reactor 21. The inlet manifold 18 can supply the reactant vapor to a reaction chamber 30 of the reactor 21. A dispersion device 35, such as a showerhead as shown, or a horizontal injection device in other embodiments, can include a plenum 32 in fluid communication with a plurality of openings 19. The reactant vapor can pass through the openings 19 and to be supplied into the reaction chamber 30. A substrate support 22 can be configured, or sized and shaped, to support a substrate 36, such as a wafer, within the reaction chamber 30. The dispersed reactant vapor can contact the substrate and react to form a layer (e.g., a monolayer) on the substrate. The dispersion device 35 can disperse the reactant vapor in a manner so as to form a uniform layer on the substrate.

An exhaust line 23 can be in fluid communication with the reaction chamber 30. A vacuum pump 24 can apply suction to the exhaust line 23 to evacuate vapors and excess materials from the reaction chamber 30. The reactor 21 can comprise any suitable type of semiconductor reactor, such as an atomic layer deposition (ALD) device, a chemical vapor deposition (CVD) device, etc.

In the embodiment of FIG. 1, a pressure transducer 12 can monitor the pressure within the process control chamber 10. A feedback circuit can electrically connect the pressure transducer 12 with the process control valve 9. A control system 34 can control the operation of various components of the device 1. The control system 34 can comprise processing electronics configured to control the operation of one or more of the valves 6, 7, 9, 11, the pressure transducer 12, the process control chamber 10, the reactor 21 (and the various components therein), and the vacuum pump 24. In some embodiments, one or more of the valves (such as the valve 7) can be manually controlled for switching or recharging the solid source 2. Although illustrated as a single structure in FIG. 1, it should be appreciated that the control system 34 can include a plurality of controllers or subsystems that have processors, memory devices, and other electronic components that control the operation of the various components of the device 1. As used herein, the term "control system" includes any combination of individual controller devices and processing electronics that may be integrated with or connected to other devices (such as valves, sensors, etc.). Thus, in some embodiments, the control system 34 can include a centralized controller that controls the operation of multiple (or all) system components. In some embodiments, the control system 34 can comprise a plurality of distributed controllers that control the operation of one or more system components. Control sequences can be hardwired or programmed into the control system 34.

As explained above, it can be challenging to control the sublimation of the solid reactant source for delivery to the reactor 21. Beneficially, the embodiment of FIG. 1 can include feedback control of measured pressure in the process control chamber 10 to control the concentration or dose of vaporized reactant provided to the process control chamber 10. For example, the process control valve 9 can be activated by the control system 34 to close and open based on measured pressure in the process control chamber 10.

As shown in FIG. 1, the device 1 can include a first thermal zone 13 that is maintained at a first temperature and a second thermal zone 14 that is maintained at a second temperature. In various embodiments, the second temperature of the second thermal zone 14 can be higher than the first temperature of the first thermal zone 13 in order to minimize risk of condensation of the naturally solid reactant.

In various embodiments, for example, the second temperature can be higher than the first temperature by a temperature difference in a range of 5° ° C. to 45° C., in a range of 10° C. to 40° C., or in a range of 20° C. to 30° C. In various embodiments, one or more of the solid source vessel 2, the inactive gas source 3, the inactive gas valve 6, and the reactant gas valve 7 can be disposed within the first thermal zone 13. The first thermal zone can be maintained at a temperature sufficiently high so as to sublimate the solid reactant particles into vaporized reactant, but not so high as to cause thermal decomposition of the reactant. The second thermal zone 14 can comprise one or more of the filter 8, the process control valve 9, the process control chamber 10, the pressure transducer 12 and the reactor supply valve 11, along with the supply lines that connect the components within the second thermal zone 14. The pressure transducer 12 can be disposed in the second thermal zone 14, for example, inside the process control chamber 10.

If the thermal zones 13, 14 are separated, then portions of the supply line 5 between the zones can be provided with heater jackets to maintain the line at or above the temperature of the first thermal zone 13. Placing the filter 8 within the heated second thermal zone 14 can beneficially enhance the capture and vaporization of liquid droplets or solid particulates that may be delivered through the filter 8.

In the illustrated embodiment, the process control valve 9, the reactor supply valve, the pressure transducer 12, and/or electronic components of the control system 34 can be manufactured to be compatible with high temperature processing. For example, the process control valve 9 can comprise a high temperature diaphragm valve with a fast response, such as ALD or DH series valves manufactured by Swagelok Company of Solon, Ohio. The pressure transducer 12 can likewise comprise a high temperature-compatible sensor, such as a capacitance manometer pressure transducer. Some components or wiring of the control system 34 can also be configured to operate in high temperature environments.

During operation, the pressure transducer 12 can monitor the pressure of the process control chamber 10 and transmit the measured pressures to the control system 34. Based on the measured pressure, the control system 34 can send instructions to the control valve 9 to open or close the valve 9, in embodiments in which the valve 9 comprise a binary on/off valve. For example, in various embodiments, a closed loop control system can control the opening and/or closing of the valve 9 (e.g., valve timing, frequency, etc.) based on feedback of the pressure of the process control valve 9 measured by the pressure transducer 12. In various embodiments, for example, a proportional-integral-derivative (PID) controller can be used to control the operation of the control valve 9. In some embodiments, the control system 34 can determine the time duration in which the control valve 9 is to open in order to reach or maintain a desired process control chamber setpoint pressure that is provided to the PID or other controller. Moreover, reactor supply valve 11 can be programmed to have a pulse time selected to produce a desired dose of reactant vapor to the reaction chamber 30, based at least in part on the setpoint pressure for the process control chamber 10, e.g., on the pressure of reactant vapor in the process control chamber 10. The flow rate of reactant vapor to the reaction chamber 30 can be determined based at least in part on the pressure in the process control chamber (e.g., approximately the same as the pressure setpoint) and the pulse time of the reactor supply valve 11. The amount of solid source consumed in the solid source vessel 2 can be estimated based on the flow rate. In various embodiments, the pulse time of the reactor supply valve 11 can be adjusted to account for solid source consumption in the vessel 2. The control system 34 can automatically adjust the refill time of the process control chamber 10 if the sublimation rate of the reactant changes. Beneficially, controlling the metering of reactant vapor to the process control chamber 10 based on measured pressure in the chamber 10 can improve wafer yield and uniformity of deposition. In other embodiments, the control system 34 can send instructions to the control valve 9 to adjust the flow conductance so as to increase or decrease the flow rate of reactant vapor through the valve 9 along a plurality of flow conductance values.

The control system 34 according to various embodiments can also automatically account for changes in sublimation rate over time. For solid precursors, the sublimation rate may depend at least in part on the geometry of the source vessel 2. For example, as solid precursor is consumed, the interior volume of the source vessel 2 may change and the exposed surface area of the solid material may also change, as clumps of solid material may be disposed in some areas of the vessel 2 while other areas of the vessel 2 may be void of solid material. Changes in the source vessel 2 volume and exposed solid precursor surface area can change the sublimation rate, and may affect the reactant content of the gas delivered to the reactor. Beneficially, the setpoint pressure for the control valve 9 can be set at a lower level than the vapor pressure of the solid source and can be selected to automatically compensate for changing sublimation rates. For example, if sublimation rate decreases, the valve 9 may automatically compensate by remaining open for a longer period of time to reach the control pressure setpoint. Beneficially, the use of closed loop feedback control for the control valve 9 can therefore automatically compensate for changes in sublimation rate without having a user continually monitor and compensate for sublimation rate changes.

Accordingly, the process control valve 9, the pressure transducer 12, and the feedback circuit with the control system 34 can accurately control the pressure in the process control chamber 10 to provide for efficient and effective dose metering or delivery of vapor phase reactant from the solid reactant source. Utilizing high temperature-compatible valve 9, pressure transducer 12, and/or components of the control system 34 can also reduce the overall size of the system and can provide closed-loop feedback control to accurately supply vaporized reactant to the reactor 21.

Figure 2:
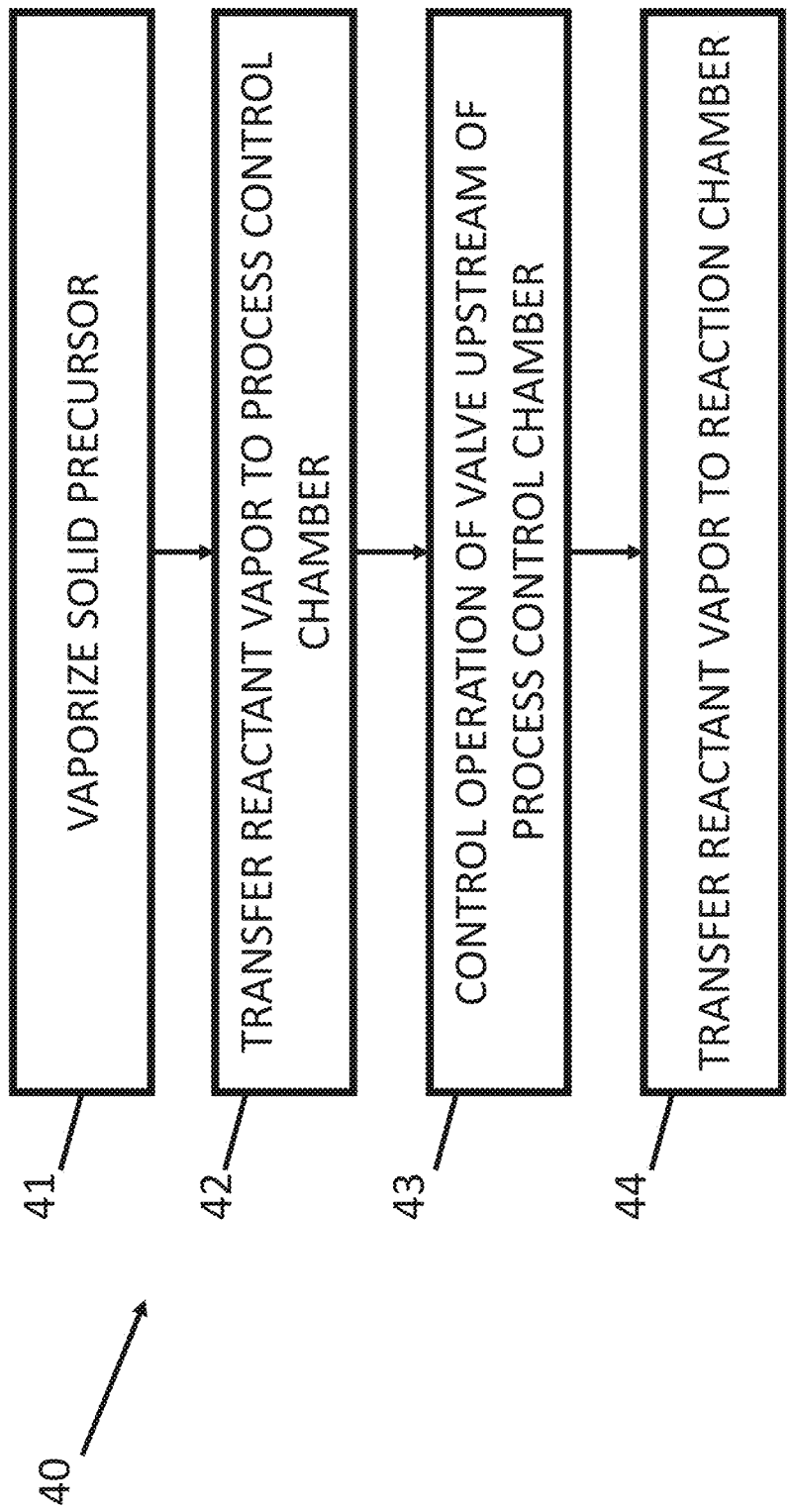
FIG. 2 is a flowchart illustrating a semiconductor processing method, according to various embodiments.

FIG. 2 is a flowchart illustrating a semiconductor processing method 40, according to various embodiments. The method 40 begins in a block 41, in which solid reactant (e.g., deposition precursor) particulates are vaporized into a reactant vapor through a sublimation process. For example, particles of solid reactant can be placed in a solid source vessel and heated to a temperature above the sublimation temperature. In some embodiments, an inactive carrier gas can be provided to help deliver the reactant vapor to the reactor. In other embodiments, a separate inactive carrier gas may not be employed. In various embodiments, the solid source vessel can be disposed in a first thermal zone that includes one or more heaters configured to maintain a first temperature of the first thermal zone above a sublimation temperature of the reactant material. In various embodiments, for example, higher temperatures for the first thermal zone can provide increased utilization of solid precursor. The temperature of the first thermal zone can be made sufficiently high (e.g., above the sublimation temperature) so as to prevent resolidification of the vaporized precursor.

Moving to a block 42, the reactant vapor can be transferred to a process control chamber. For example, a valve (such as the reactant valve 7) can be controllably opened and closed to deliver reactant vapor from the source 2 to a reactant gas line. As explained above, in various embodiments, the reactant valve 7 can comprise an on/off valve. In some embodiments, the reactant vapor can pass through a heated filter that captures solid particles or droplets and ensures that the delivered reactant is in the vapor phase. The process control chamber can serve as an intermediate metering volume in which vaporized reactant is collected before being delivered to the reaction chamber of the reactor.

In a block 43, the operation of a process control valve located upstream of the process control chamber can be controlled by a control system. In various embodiments, for example, the process control valve can be adjusted (e.g., shut on or off, or adjusted to a set flow conductance) based at least in part on a measured pressure of the process control chamber. As explained herein, a pressure transducer can be used to monitor the pressure within the process control chamber. The control system can utilize a suitable control method (such as closed loop control by way of a pressure setpoint in a PID controller) to control admission of reactant vapor to the process control chamber via the process control valve. In various embodiments, one or more of the process control chamber 10, the filter 8, the process control valve 9, and the pressure transducer 12, can be disposed inside a second thermal zone, which may be set at a higher temperature as compared with the first thermal zone.

Moving to a block 44, the vaporized reactant in the process control chamber can be transferred to the reactor. In various embodiments, a reactor supply valve downstream of the process control chamber can be activated to supply the vaporized reactant to the reaction chamber. In various embodiments, for example, the reactor supply valve can be configured to pulse the vaporized reactant into the reactor. Pulsing of the reactor supply valve can be controlled by the control system according to a process recipe for the deposition, that may be hardwired or programmed into the control system.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the disclosed embodiments. Moreover, not all of the features, aspects and advantages described herein above are necessarily required to practice the present embodiments.

What is claimed is:

1. A semiconductor processing device comprising:
   a reactor;
   a vessel configured to supply a vaporized reactant to the reactor;
   a process control chamber in fluid communication with the vessel and the reactor between the vessel and the reactor, wherein the process control chamber is configured to collect vaporized reactant before being delivered to the reactor;
   a process control valve upstream of the process control chamber between the vessel and the process control chamber;
   a pressure transducer configured to measure the pressure in the process control chamber; and a control system configured to receive a signal from the pressure transducer indicating a measured pressure in the process control chamber.

2. The device of claim 1, wherein the control system is further configured to control operation of the process control valve based on the measured pressure in the process control chamber.

3. The device of claim 2, wherein control of the operation of the process control valve is based solely on feedback of measured pressure in the process control chamber.

4. The device of claim 1, further comprising a reactor supply valve downstream of the process control chamber between the reactor and the process control chamber.

5. The device of claim 2, wherein the control system comprises a proportional-integral-derivative (PID) controller.

6. The device of claim 1, further comprising a first thermal zone at a first temperature and a second thermal zone at a second temperature higher than the first temperature, wherein the vessel is disposed in the first thermal zone, and wherein the process control valve and the process control chamber are disposed in the second thermal zone.

7. The device of claim 4, wherein the control system is further configured to control operation of the process control valve and the reactant supply valve, wherein control of the operation of the process control valve is based at least in part on a pulse time of the reactor supply valve.

8. The device of claim 4, wherein the control system is further configured to control operation of the process control valve and the reactant supply valve, wherein control of the reactant supply valve is based at least in part on a setpoint pressure in the process control chamber.

9. The device of claim 1, further comprising a filter disposed between the vessel and the process control chamber.

10. A semiconductor processing device comprising:
a vessel disposed in a first thermal zone at a first temperature, wherein the vessel is configured to supply a reactant;
a process control chamber downstream of and in fluid communication with the vessel, the process control chamber disposed in a second thermal zone at a second temperature that is higher than the first temperature and configured to collect and transfer the reactant to a reactor downstream of the process control chamber; and
a process control valve upstream of the process control chamber and disposed in the second thermal zone between the vessel and the process control chamber.

11. The device of claim 10, wherein the second temperature is higher than the first temperature by an amount in a range of 5° C. to 45° C.

12. The device of claim 10, wherein the first temperature is higher than a temperature to sublimate the vaporized reactant.

13. The device of claim 12, wherein the first temperature is lower than a temperature to thermally decompose the vaporized reactant.

14. The device of claim 10, further comprising a filter in the second thermal zone.

15. The device of claim 10, further comprising a supply line between the vessel and the process control chamber, wherein the supply line is maintained at or above the first temperature.

16. A method of delivering a reactant vapor to a reaction chamber, the method comprising:
providing a reactant vapor in a vessel;
transferring the reactant vapor from the vessel to a process control chamber;
collecting the reactant vapor in the process control chamber;
measuring the pressure of the reactant vapor in the process control chamber; and
transferring the reactant vapor from the process control chamber to a reaction chamber.

17. The method of claim 16, further comprising controlling operation of a process control valve upstream of the process control chamber.

18. The method of claim 17, wherein controlling operation of a process control valve upstream comprises using a proportional-integral-derivative (PID) controller.

19. The method of claim 17, wherein controlling operation of a process control valve upstream is based at least in part on feedback of measured pressure in the process control chamber.

20. The method of claim 17, wherein controlling the operation of the process control valve comprises controlling a duration in which the process control valve is opened.

* * * * *